United States Patent [19]

Poe et al.

[11] Patent Number: 5,223,821
[45] Date of Patent: Jun. 29, 1993

[54] TRIAC POWER SWITCHING AND TESTING SYSTEM

[75] Inventors: Eric L. Poe, Dallas; Billy R. Slater, Plano, both of Tex.

[73] Assignee: Forney International, Inc., Addison, Tex.

[21] Appl. No.: 783,233

[22] Filed: Oct. 28, 1991

[51] Int. Cl.[5] ............................................. G08B 21/00
[52] U.S. Cl. .................................... 340/645; 340/644; 340/653; 324/158 SC
[58] Field of Search .............. 340/635, 644, 645, 653, 340/657; 324/158 SC, 158 R, 537; 307/632; 361/100; 363/54, 57, 68

[56] References Cited

U.S. PATENT DOCUMENTS

| | | | |
|---|---|---|---|
| 3,648,233 | 3/1972 | Clark | 340/644 |
| 3,854,092 | 12/1974 | Tani et al. | 324/158 SC |
| 4,415,884 | 11/1983 | Delin et al. | 340/645 X |
| 4,533,241 | 12/1986 | Casteel et al. | 340/645 |
| 4,554,507 | 11/1985 | Brown | 324/158 SC |
| 4,659,983 | 4/1987 | Jacob . | |
| 4,799,019 | 11/1989 | Cooley et al. | 324/546 |
| 4,884,025 | 11/1989 | Häusler | 324/158 SC |

Primary Examiner—Jin F. Ng
Assistant Examiner—Jeffery A. Hofsass
Attorney, Agent, or Firm—Lane, Aitken & McCann

[57] ABSTRACT

In a triac power switching system, two triacs are connected in series between an AC power source and a load. Each time power is applied to a load, the triacs are tested by first turning on one of the triacs while maintaining the other triac turned off, then turning on both triacs to apply power to the load for a set time interval and then turning off one of the triacs and determining whether power is still applied to the load. If power is applied to the load while either one of the triacs is supposed to be off, an alarm is sounded. In addition, if power is not applied to the load when both triacs are turned on, an alarm is sounded.

11 Claims, 2 Drawing Sheets

TRIAC POWER SWITCHING AND TESTING SYSTEM

BACKGROUND OF THE INVENTION

This invention relates to a triac switching circuit used to control the application of AC power to loads and, more particularly, to a system for testing the operability of a triac switching circuit while the circuit performs its switching function.

Industrial control systems need to apply AC power to a load, such as a motor, for a controlled period of time and to reliably turn the application of the power to the load off and on. For example, in a motor-operated valve controller, a motor is energized for a selected period of time to position the valve at a desired set point. Other examples are induced draft and forced draft fans in power plants. Misoperation of such fans can damage the boiler or duct work of the power plant. In typical systems, the turning off and on of the AC power to the load is done by triacs. When a triac fails, it usually fails in the form of a short circuit causing the AC power to remain applied to the load. When the control system calls for the application of power to the load to be terminated under some circumstances, this situation can be hazardous. The triac can also fail in an open position. This condition would manifest itself eventually as failure of the equipment to be powered. It is desirable, however, to have an indication of this kind of failure as soon as the triac fails for safer operation.

SUMMARY OF THE INVENTION

The present invention is designed to minimize the possibility of power being stuck on and to provide an early indication of when the triacs are stuck open. In accordance with the present invention, the triac switching circuit is in the form of two triacs connected in series between the AC power and the load. One of the two triacs can be turned on and off by a pulse generator which controls the length of time power is applied to the load by controlling the duration of a pulse applied to the control electrode of the triac. This triac can also be turned off and on by a signal from a microprocessor, which also controls the turning off and on of a second triac connected in series.

In accordance with the invention, each time power is to be applied to the load for a controlled period of time, the microprocessor first turns on the first triac while the other triac remains off and tests for the presence of power applied to the load. If power is applied to the load, this means that the other triac is shorted and an alarm is generated. The microprocessor then turns off the first triac and turns on the second triac and also signals the pulse generator to apply a pulse to the first triac. The pulse generator then applies a pulse of a selected duration to the first triac. With both triacs on, power should be applied to the load. If no power is present, an alarm is generated. At the end of the pulse from the pulse generator, the first triac should be turned off. The microprocessor making use of a timer independent of the pulse generator determines when the pulse applied to the first triac should be turned off and, at the end of the time period determined by the microprocessor, the microprocessor senses whether or not AC power is still applied to the load. If so, this means that either the pulse generator is malfunctioning or the first triac is shorted and an alarm is generated indicating the malfunction. In either case, the microprocessor turns off the second triac to terminate the application of power to the load. In this manner, both triacs are tested each time power is applied to the load and the reliability of the switching system is greatly enhanced.

DESCRIPTION OF A PREFERRED EMBODIMENT

Figure 1:
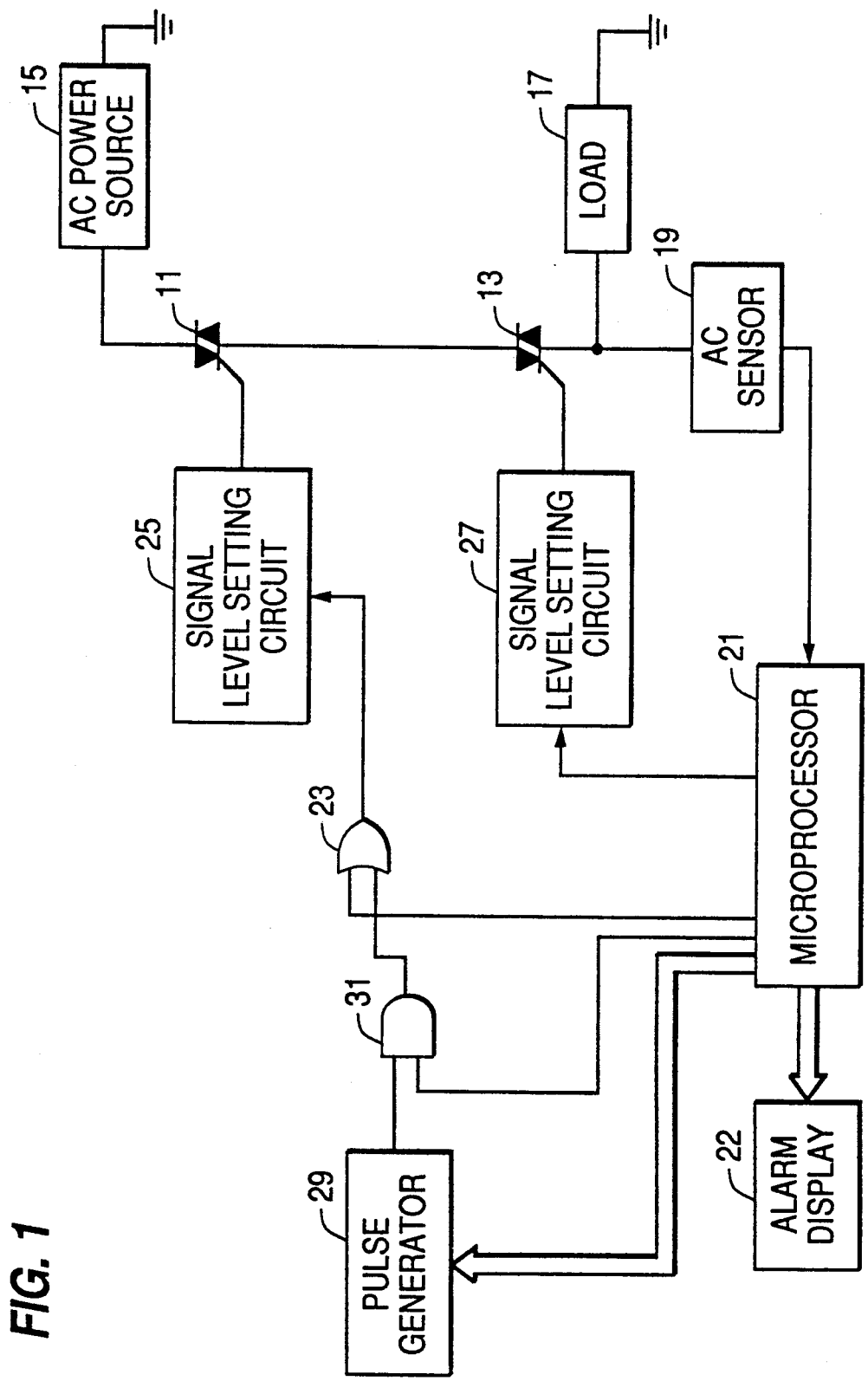
FIG. 1 of the drawings schematically illustrates the circuit of the invention.

As shown in FIG. 1, triacs 11 and 13 are connected in a series between a source of AC power 15 and a load 17. When both triacs 11 and 13 are rendered conducted, the AC power from the source 15 will be applied across the load 17 to ground. When AC power is applied across the load 17, this condition will be detected by an AC power detector 19 which applies a signal to a microprocessor 21 indicating that power is present and is being applied to the load.

Figure 2:
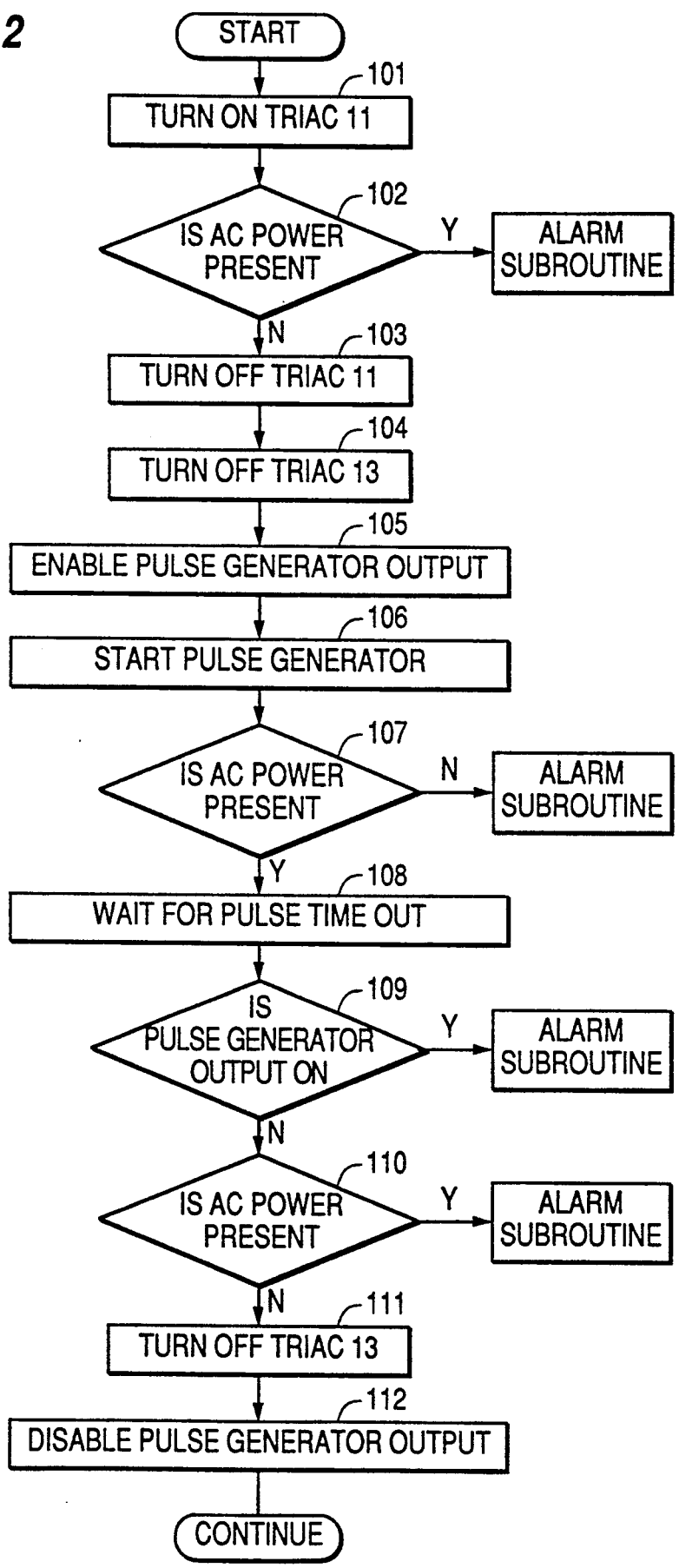
FIG. 2 is a flow chart of a program executed by a microprocessor in the system of the invention.

Each time power is applied to the load, the microprocessor executes the program and as shown in FIG. 2 listed below in pseudo-code:

```
101   Turn on triac 11
102   If AC present then
          Turn off triac 11
          ALARM: triac 13 shorted
          Stop
103   Turn off triac 11
104   Turn on triac 13
105   Enable Pulse Generator output
106   Start Pulse Generator
107   If AC not present then
          If Pulse Generator output not on then
              ALARM: Pulse Generator failure
              Disable Pulse Generator output
          Else if motive power not present then
              ALARM: Loss of motive power
          Else ALARM: Triac(s) open
          Turn off triac 13
          Stop
108   Wait for pulse timeout
109   If Pulse Generator output on then
          ALARM: Pulse Generator failure
          Disable Pulse Generator output
          If AC present then
              Turn off triac 13
              If AC present then
                  ALARM: Output stuck on
              Else ALARM: triac 11 shorted
              Stop
110   If AC present then
          Turn off triac 13
          If AC present then
              ALARM: Output stuck on
          Else ALARM: triac 11 shorted
          Stop
111   Turn off triac 13
112   Disable Pulse Generator output
113   Continue
```

FIG. 2 is a flow chart illustrating the above listed program. In the above program, and as shown in FIG. 2 the microprocessor 21 in step 101 applies a signal through OR gate 23 to a signal level setting circuit 25, which applies a signal to the gate of the triac 11 to turn it on. At this time, the triac 13 will be turned off, so no power should be applied to the load. Accordingly, the AC power detector 19 should detect no AC power. If the AC power detector 19 detects AC power, the AC power detector 19 will signal the microprocessor 21 accordingly. In response to the signal the microprocessor in step 102 will enter an alarm subroutine, in which the microprocessor will terminate the enabling signal applied through OR gate 23 to turn the triac 11 off and will generate an alarm causing alarm display 22 to indicate that the triac 13 is shorted. The alarm display is preferably in the form of a text displayed on a screen, but it may be in the form of a signal lamp or other form of informative alarm display. When an alarm is generated the turn on process terminates.

If no AC power is detected by the AC power detector 19 in step 102, the microprocessor 21 proceeds to the next step 103 in the turn-on process. In this next step, the microprocessor 21 terminates the signal applied through OR gate 23 to the signal level setting circuit 25 so that the triac 11 is turned off. Next, in step 104, the microprocessor applies a signal to the signal 11 setting circuit 27, which in response to receiving this signal, turns on the triac 13. Next, in step 105, the microprocessor 21 applies an enabling signal to AND gate 31 to enable the output of the pulse generator 29. Then the microprocessor, in step 106, starts the pulse generator 29 by inserting a value into a counter of the pulse generator 29. The counter in the pulse generator will count down its registered value to zero in response to internal clock pulses. The pulse generator will produce an output pulse until the count in the counter reaches zero. In this manner, the length of the pulse generated by the pulse generator is controlled by the microprocessor 21. The output pulse generated by the pulse generator 29 is applied through the enabled AND gate 31 and then through the OR gate 31 to the signal level setting circuit 25, which turns on the triac 11. Thus, both triacs 11 and 13 should be turned on and power applied to the load. The AC power detector 19, accordingly, should signal the microprocessor 21 that power is applied to the load. If AC power is not present, this means that one of the triacs 11 or 13 did not turn on. Accordingly, in step 107, the microprocessor responds to the signal from the AC power detector. If AC power is not present at the load at step 107, the microprocessor enters into an alarm subroutine, in which the microprocessor first determines whether the pulse generator 29 is producing an output pulse. The output pulse produced by the pulse generator is applied to the microprocessor for the purpose of making this determination. If the pulse generator is not producing an output pulse, the microprocessor causes the alarm display to indicate that the pulse generator 29 has failed. In addition, the microprocessor terminates the enabling signal applied to the AND gate 31. If the pulse generator is producing an output pulse, then the microprocessor determines whether power is available from the power source 15. If not, the alarm indicates that there is a loss of motive power. If motive power is present, the alarm indicates that the triacs 11 and 13 malfunctioned and did not open. At the end of this alarm subroutine, the microprocessor terminates the signal to the triac 13 to turn it off and terminates the turn-on process.

If the microprocessor 21 detects that power is present in step 107, the program proceeds to step 108. When the output pulse from the pulse generator 29 terminates, the signal level detector 25, in response to the end of this pulse received through the AND gate 31 and the OR gate 23, will turn off the triac 11 and, thus, turn off power to the load 17. In this manner, power is turned on to the load for the period determined by the value applied to the pulse generator 29 by the microprocessor 21. The microprocessor waits in step 108 until its own internal timer determines when the output pulse of the pulse generator 29 should have terminated and then proceeds to step 109.

In step 109, the microprocessor determines whether the pulse generator is still producing an output pulse. If the pulse generator 29 is still producing an output pulse after the timer of the microprocessor 21 indicates that it should have terminated, the microprocessor enters an alarm subroutine, in which the microprocessor causes the alarm display 22 to indicate pulse generator failure and disables the pulse generator output by terminating the enabling signal applied to the AND gate 31 so that the triac 11 will be turned off. Then, if AC power is still detected by the detector 19, the microprocessor 21 will turn off the triac 13. At this time, if AC power is still detected by the power detector 19, the microprocessor causes an alarm to be displayed indicating that the triac output is stuck on. If AC is not present, then the microprocessor causes an alarm to be displayed indicating that the triac 11 is shorted. At the end of this alarm subroutine, the microprocessor program terminates.

If, in step 109, the microprocessor 21 determines that the pulse generator pulse has terminated, the program proceeds to step 110, in which the microprocessor determines whether AC power is being detected by the AC power detector 19. If the detector 19 indicates the presence of power in step 110, the microprocessor enters an alarm subroutine, in which the microprocessor turns off the triac 13 by terminating the signal applied to the signal level setting circuit 27. Then if the power detector 19 indicates that power is still present, the microprocessor causes an alarm to be displayed indicating the output is stuck on. If the AC power is not present, then the microprocessor causes the alarm displayed to indicate that the triac 11 is shorted whereupon the turn-on progress terminates.

If AC power is not detected by detector 19 in step 110, this means that the turn-on turn-off process has been successfully completed. At this time, the microprocessor 21 will turn off the triac 13 by the signal applied to the signal level detector 27 and the microprocessor will disable the output signal from the pulse generator 29 by disabling the AND gate 31.

In the above-described manner, the applicant's system effectively tests the operability of each triac each time the power is applied to the load and damage to the system resulting from malfunction in the turning on and turning off of the power due to failure of either one or both of the triacs is avoided.

The above description is of a preferred embodiment of the invention and modification may be made thereto without departing from the scope of the invention defined by the appended claim.

We claim:

1. A switching system comprising a source of AC power, a load, first and second triacs connected in series between said source of power and said load, and program means to turn on said first triac while said second triac is turned off and to determine whether power is applied to said load in a first step, turn on said first and second triacs and determine whether power is applied to said load in a second step, turn on said second triac while said first triac is turned off and determine whether power is applied to said load in a third step.

2. A triac switching system as recited in claim 1, wherein said program means generates an alarm if power is applied to said load in said first and third steps or is not applied to said load in said second step.

3. A triac switching system as recited in claim 2, wherein said alarm indicates that one of said triacs is shorted if power to said load is detected in said first step or said third step and indicates that said triacs are open if power is not detected in said second step.

4. A triac switching system as recited in claim 1, wherein said program means performs said first, second and third steps in the sequence as numbered.

5. A triac switching system as recited in claim 4, wherein said program means maintains said first and second triacs turned on in said second step for a predetermined length of time.

6. A triac switching system as recited in claim 5, wherein said predetermined length of time is variable.

7. A triac switching system as recited in claim 1, wherein said program means includes a pulse generator to apply a pulse of predetermined variable length to the control electrode of one of said triacs.

8. A triac switching system as recited in claim 7, wherein said program means includes a microprocessor operable to store a value in said pulse generator representing the length of pulse to be generated by said pulse generator, said pulse generator generating a pulse in accordance with the value received from said microprocessor.

9. A triac switching system comprising a source of AC power, a load, first and second triacs connected between said source of AC power and said load, a pulse generator connected to apply a pulse of a predetermined length to a control electrode of said first triac to turn said first triac on, and microprocessor means to turn on said first triac while maintaining said second triac off and determining whether power is applied to said first triac in a first step, causing said pulse generator to apply a pulse to said first triac while turning said second triac on in a second step, after the end of said pulse, turning said second triac on while maintaining said first triac off in a third step, and determining whether power is applied to said load during said first step or said third step and generating an alarm if power is detected in said first step or said third step.

10. A triac switch system as recited in claim 9, wherein the length of pulse produced by said pulse generator is variable.

11. A triac switching system as recited in claim 10, wherein said microprocessor means comprises means to store a value in said pulse generator representing the length of pulse to be generated, said pulse generator generating said pulse with a length in accordance with said value.

* * * * *

UNITED STATES PATENT AND TRADEMARK OFFICE
CERTIFICATE OF CORRECTION

PATENT NO. : 5,223,821

DATED : June 29, 1993

INVENTOR(S) : Eric L. Poe et al.

It is certified that error appears in the above-identified patent and that said Letters Patent is hereby corrected as shown below:

Column 2, line 7, delete "of the drawings";

line 24, delete "and as shown in FIG. 2).

Signed and Sealed this

Ninth Day of August, 1994

Attest:

BRUCE LEHMAN

Attesting Officer

Commissioner of Patents and Trademarks